United States Patent
Park et al.

(10) Patent No.: US 9,583,584 B2
(45) Date of Patent: Feb. 28, 2017

(54) METHODS FOR PRODUCING INTEGRATED CIRCUITS USING LONG AND SHORT REGIONS AND INTEGRATED CIRCUITS PRODUCED FROM SUCH METHODS

(71) Applicants: GLOBALFOUNDRIES, INC., Grand Cayman (KY); International Business Machines Corporation, Armonk, NY (US)

(72) Inventors: Chanro Park, Clifton Park, NY (US); Injo Ok, Loudonville, NY (US)

(73) Assignees: GLOBALFOUNDRIES, INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/795,984

(22) Filed: Jul. 10, 2015

(65) Prior Publication Data

US 2017/0012107 A1    Jan. 12, 2017

(51) Int. Cl.
*H01L 21/70*  (2006.01)
*H01L 29/49*  (2006.01)
*H01L 29/66*  (2006.01)
*H01L 21/82*  (2006.01)

(52) U.S. Cl.
CPC .......... *H01L 29/4966* (2013.01); *H01L 21/70* (2013.01); *H01L 21/82* (2013.01); *H01L 29/66545* (2013.01)

(58) Field of Classification Search
CPC ........... H01L 29/4966; H01L 29/66545; H01L 29/66606; H01L 27/0203; H01L 27/118; H01L 27/00; H01L 27/11807; H01L 21/70; H01L 21/77; H01L 21/82; H01L 21/8236; H01L 2924/14
See application file for complete search history.

(56) References Cited

U.S. PATENT DOCUMENTS

| | | | | |
|---|---|---|---|---|
| 2011/0001194 A1* | 1/2011 | Hou | ............... | H01L 21/823835 257/369 |
| 2011/0248359 A1* | 10/2011 | Hwang | ........... | H01L 21/823842 257/410 |
| 2013/0280900 A1* | 10/2013 | Lai | ................. | H01L 21/823842 438/589 |
| 2014/0008720 A1* | 1/2014 | Xie | ....................... | H01L 27/092 257/331 |

(Continued)

*Primary Examiner* — Galina Yushina
(74) *Attorney, Agent, or Firm* — Lorenz & Kopf, LLP (57) ABSTRACT

Integrated circuits and methods for producing the same are provided. In an exemplary embodiment, a method for producing an integrated circuit includes forming a work function layer overlying a substrate and a plurality of dielectric columns. The dielectric columns and the substrate define a short region having a short region width and a long region having a long region width greater than the short region width. The work function layer is recessed in the long region to a long region work function height that is between a dielectric column top surface and a substrate top surface. The work function layer is also recessed in the short region to a short region work function height that is between the dielectric column top surface and the substrate top surface. Recessing the work function layer in the long and short regions is conducted in the absence of lithography techniques.

18 Claims, 6 Drawing Sheets

(56) References Cited

U.S. PATENT DOCUMENTS

| | | | | |
|---|---|---|---|---|
| 2014/0077313 A1* | 3/2014 | Li | ................... | H01L 21/823842 257/410 |
| 2015/0214112 A1* | 7/2015 | Zhao | ................... | H01L 29/4966 257/369 |
| 2015/0380251 A1* | 12/2015 | Glodde | ............. | H01L 21/28123 438/591 |
| 2016/0104704 A1* | 4/2016 | Fang | ................... | H01L 29/4966 257/392 |

* cited by examiner

METHODS FOR PRODUCING INTEGRATED CIRCUITS USING LONG AND SHORT REGIONS AND INTEGRATED CIRCUITS PRODUCED FROM SUCH METHODS

TECHNICAL FIELD

The technical field generally relates to methods for producing integrated circuits using long and short gates and integrated circuits produced from such methods, and more particularly relates to methods for producing integrated circuits using long and short gates with reduced lithographic processes and integrated circuits produced from such methods.

BACKGROUND

The majority of present day integrated circuits (ICs) are implemented by using a plurality of interconnected field effect transistors (FETs), also called metal oxide semiconductor field effect transistors (MOSFETs or MOS transistors). A FET includes a gate electrode as a control electrode overlying a semiconductor substrate and spaced-apart source and drain regions in the substrate between which a current can flow. A gate insulator is disposed between the gate electrode and the semiconductor substrate to electrically isolate the gate electrode from the substrate. A control voltage applied to the gate electrode controls the flow of current through a channel in the substrate underlying the gate electrode between the source and drain regions. The FETs are generally "N" or "P" type FETs, ("nFET" or "pFET") where the source and drain for nFETs are implanted with "N" type conductivity-determining ions, and the source and drain for pFETs are implanted with "P" type conductivity determining ions.

The gate electrode may be a replacement metallic gate, where a temporary, sacrificial gate, which is called a "dummy" gate, is initially formed while other components of the FET are produced. A dielectric column is formed overlying the source and drain, and the dummy gate is removed from between adjacent dielectric columns. The dielectric column may include a dielectric barrier and a dummy core. The replacement metallic gate is then formed, and the dummy cores are removed and replaced with contacts extending upward from the source and drain. The dielectric barrier, which is commonly known as a spacer, is between and physically separates the replacement metallic gate and the contact. Therefore, the dielectric barrier insulates the contact from the replacement metallic gate, but the dielectric barrier ends at the dielectric column top surface. In some cases, a short may develop where the replacement metallic gate becomes electrically connected with the contacts at or near the dielectric column top surface. The replacement metallic gate may be recessed to a lower level to increase the amount of dielectric barrier between the replacement metallic gate and the contact, and thereby reduce the chance of a short.

The integrated circuit may include different types of replacement metallic gates, where some are formed in a short region with a short region width and some are formed in a long region with a longer width. Somewhat different processes are conventionally used to recess the replacement metallic gate in the short regions as compared to recessing the replacement metallic gate in the long regions, and lithographic processes may be used for the different processes. Lithographic processes are one of the more expensive processes in the manufacture of integrated circuits.

Accordingly, it is desirable to provide integrated circuits and methods of manufacturing integrated circuits with replacement metallic gates having different widths, where the production process uses a reduced number of lithographic processes. Other desirable features and characteristics of the present embodiment will become apparent from the subsequent detailed description and the appended claims, taken in conjunction with the accompanying drawings and this background of the invention.

BRIEF SUMMARY

Methods for producing integrated circuits and integrated circuits produced by such methods are provided. In an exemplary embodiment, a method for producing an integrated circuit includes forming a work function layer overlying a substrate and a plurality of dielectric columns. The dielectric columns and the substrate define a short region having a short region width and a long region having a long region width greater than the short region width. The work function layer is recessed in the long region to a long region work function height that is between a dielectric column top surface and a substrate top surface. The work function layer is also recessed in the short region to a short region work function height that is between the dielectric column top surface and the substrate top surface. Recessing the work function layer in the long and short regions is conducted in the absence of lithography techniques.

A method for producing an integrated circuit is provided in another embodiment. A first organic layer is formed overlying a work function layer that overlies a substrate and a plurality of dielectric columns. The dielectric columns and the substrate define a short region having a short region width and a long region having a long region width greater than the short region width. The first organic layer is recessed to about a long region work function height within the long region while removing the first organic layer from overlying the plurality of dielectric columns, where the long region work function height is between a dielectric column top surface and a substrate top surface. A sacrificial layer is formed overlying the first organic layer that is within the long region, the short region, and the dielectric columns. The sacrificial layer is then removed from over the short region and the dielectric columns while remaining in the long region. The first organic layer is recessed in the short region to a short region work function height between the dielectric column top surface and the substrate top surface, and the sacrificial layer is removed from the long region. The work function layer is removed from the short region above the short region work function height, and from the long region above the long region work function height.

An integrated circuit is provided in yet another embodiment. The integrated circuit includes a substrate with a substrate top surface and a replacement metallic gate overlying the substrate. The replacement metallic gate extends to a replacement metallic gate height above the substrate top surface, and the replacement metallic gate includes a work function layer that extends to a work function height less than the replacement metallic gate height. A plurality of dielectric barriers are adjacent to the replacement metallic gate, where the dielectric barriers extend from the substrate top surface to about a dielectric column top surface that is above the replacement metallic gate height.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

According to various embodiments described herein, a replacement metallic gate is formed in long and short regions defined between dielectric columns overlying a substrate. A work function layer of the replacement metallic gate is initially formed, where the work function layer is separately recessed in the long and short regions to a height between a dielectric column top surface and a substrate top surface. Heights referred to herein are measured from a substrate top surface unless otherwise specified. The work function layer is separately recessed in the long region and the short region in the absence of lithographic techniques. The elimination or reduction of lithography processes used to produce the integrated circuit may decrease the total production costs. The replacement metallic gate may then be formed overlying the recessed work function layer.

Figure 1:
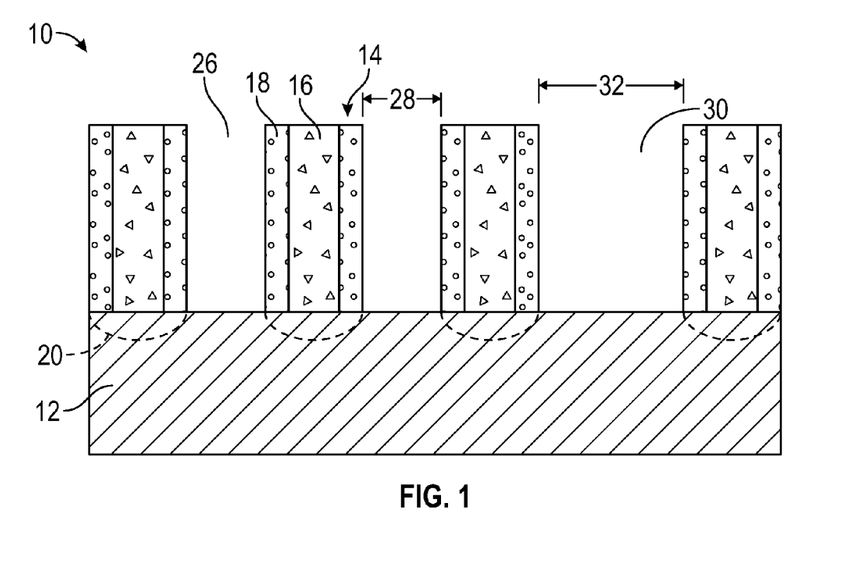
FIGS. 1-12 illustrate, in cross sectional views, a portion of an integrated circuit and methods for its fabrication in accordance with exemplary embodiments.

Reference is made to the exemplary embodiment illustrated in FIG. 1. An integrated circuit region 10 includes a plurality of dielectric columns 14 overlying a substrate 12. As used herein, the term "substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is a monocrystalline silicon substrate. The silicon substrate may be a bulk silicon wafer (as illustrated) or may be a thin layer of silicon on an insulating layer (commonly known as silicon-on-insulator or SOI) that, in turn, is supported by a carrier wafer. As used herein, the term "overlying" means "over" such that an intervening layer may lie between the dielectric column 14 and the substrate 12, and "on" such that the dielectric column 14 physically contacts the contact substrate 12.

The dielectric column 14 include a dummy core 16 and a dielectric barrier 18, where the dummy core 16 is positioned between a pair of dielectric barriers 18 for each illustrated exemplary dielectric column 14. The dummy core 16 and dielectric barrier 18 may be a variety of materials, but in an exemplary embodiment the dummy core 16 includes silicon dioxide and the dielectric barrier 18 includes silicon nitride.

The substrate 12 underlying the dielectric column 14 may include conductivity imparting ions in some embodiments, where the area containing the conductivity imparting ions is designated with a dotted line. For example, the substrate 12 may include "N" or "P" type conductivity-determining ions in various embodiments. In the illustrated example, the substrate 12 includes "N" type conductivity-determining ions underlying the dielectric columns 14, such that the substrate 12 underlying the dielectric columns 14 may serve as a source or drain for an nFET, where the source/drain are jointly designated by reference number 20. "N" type conductivity-determining ions include arsenic or phosphorous, but antimony, other materials, or combinations thereof can also be used, and different components may be implanted with the same or different "N" type conductivity determining ions in various embodiments. "P" type conductivity-determining ions include boron, aluminum, gallium, and indium, but other materials or combinations of materials can also be used, and different components may be implanted with the same or different "P" type conductivity-determining ions in various embodiments. It is to be understood that the substrate 12 underlying the dielectric columns 14 may include "P" type conductivity-determining ions in some embodiments, such that pFETs may also be formed in addition to or as an alternative to nFETs.

A short region 26 is defined between adjacent dielectric columns 14, where the short region 26 has a short region width 28. A long region 30 is also defined between adjacent dielectric columns 14, where the long region 30 has a long region width 32 that is greater than the short region width 28. The short region width 28 and the long region width 32 are taken along a direction parallel to a surface of the substrate 12 and generally perpendicular to a height of the dielectric columns 14. In some embodiments, the long region width 32 is at least twice as large as the short region width 28. In exemplary embodiments, the short region width 28 is from about 10 to about 40 nanometers (nm), or from about 20 to about 30 nanometers. The substrate 12 may have a lower concentration of conductivity-determining ions underlying the short and long regions 26, 30 than underlying the dielectric columns 14 in some embodiments, although it is to be appreciated that source/drain extension and/or halo regions (not shown) may extend into the substrate 12 underlying the short and long regions 26, 30 in accordance with convention integrated circuit architecture.

Figure 2:
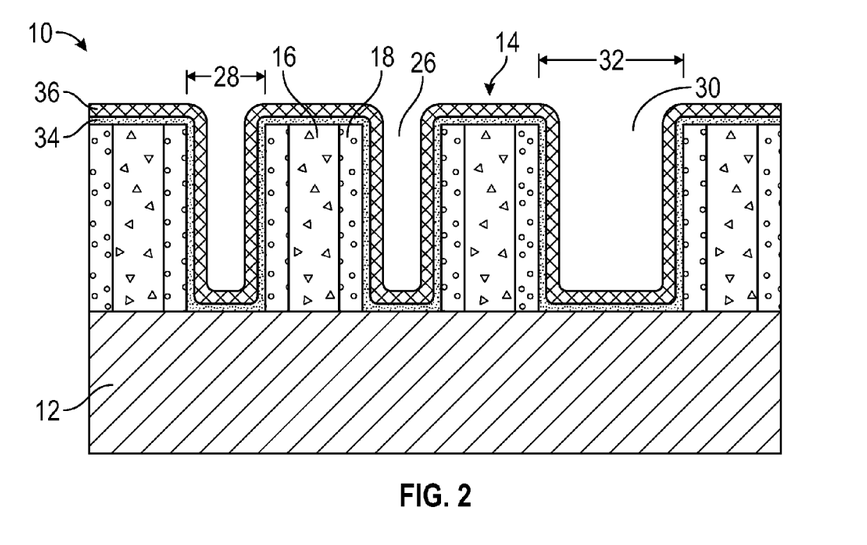

Referring to the exemplary embodiment in FIG. 2, a gate dielectric 34 is formed overlying the dielectric columns 14, along the sidewalls of the dielectric columns 14, and overlying the substrate 12 at the base of the short and long regions 26, 30. In an exemplary embodiment, the gate dielectric 34 includes silicon dioxide, which can be deposited by chemical vapor deposition using silane and oxygen. In alternate embodiments, the gate dielectric 34 may include a high K dielectric material. As used herein, a "high K dielectric" is a dielectric material with a dielectric constant (K) of about 3.7 or greater, where K is the ratio of a material's permittivity (∈) to the permittivity of a vacuum (∈o), so K=∈/∈o. Examples of high K dielectric materials include hafnium oxide and zirconium silicate, where hafnium oxide may be deposited by atomic layer deposition using a hafnium alkylamide, such as tetrakis (dimethylamido) hafnium and water.

A work function layer 36 is formed overlying the gate dielectric 34, so the work function layer 36 overlies the substrate 12 and the dielectric columns 14. In an exemplary embodiment for an nFET, the work function layer 36 includes a layer of titanium nitride, a layer of titanium carbide overlying the layer of titanium nitride, and another layer of titanium nitride overlying the layer of titanium carbide, such that the layer of titanium carbide is sandwiched between two layers of titanium nitride (although a single layer is illustrated in the Figures.) In an exemplary embodiment for a pFET, the work function layer 36 includes a layer of titanium nitride and is free of other layers beyond the titanium nitride, but other embodiments are also possible. The work function layer 36 is used to modify the threshold voltage and the on-current for the final FET.

Figure 3:
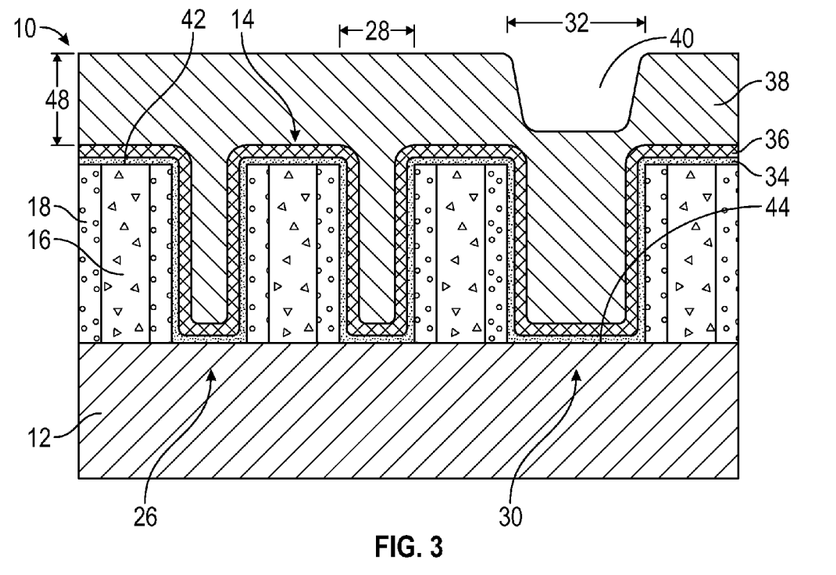

In some embodiments, a first organic layer 38 is formed overlying the substrate 12, the dielectric columns 14, the gate dielectric 34, and the work function layer 36, as illustrated in FIG. 3. The first organic layer 38 can be applied as a flowable material that is cured after spreading over the integrated circuit region 10. For example, an amorphous carbon material can be deposited by spinning on a fullerene based monomer with a crosslinking agent, and then curing at about 300° C. for 5 minutes. Spin on planarization layers are commercially available, and the first organic layer 38 may be a wide variety of different materials in various embodiments. The first organic layer 38 includes a high concentration of carbon in many embodiments, such as about 50 weight percent or more carbon, or about 70 weight percent or more carbon in various embodiments, based on the total weight of the first organic layer 38. In some embodiments, the first organic layer 38 may be formed with a first organic layer depth 48 of about 100 nanometers, such as a first organic layer depth 48 of from about 50 nanometers to about 150 nanometers. The first organic layer depth 48 is measured from a top surface of the work function layer 36 overlying the dielectric column 14 to a top surface of the first organic layer 38. The thickness of the first organic layer 38, and the viscosity of the liquid form thereof, can be adjusted based on the short and long region widths 28, 32 such that a dip 40 is formed within the first organic layer 38 overlying the long region 30. The dip 40 forms because the volume of the long region 30 accepts a sufficient quantity of the first organic layer 38 in the liquid form.

Figure 4:
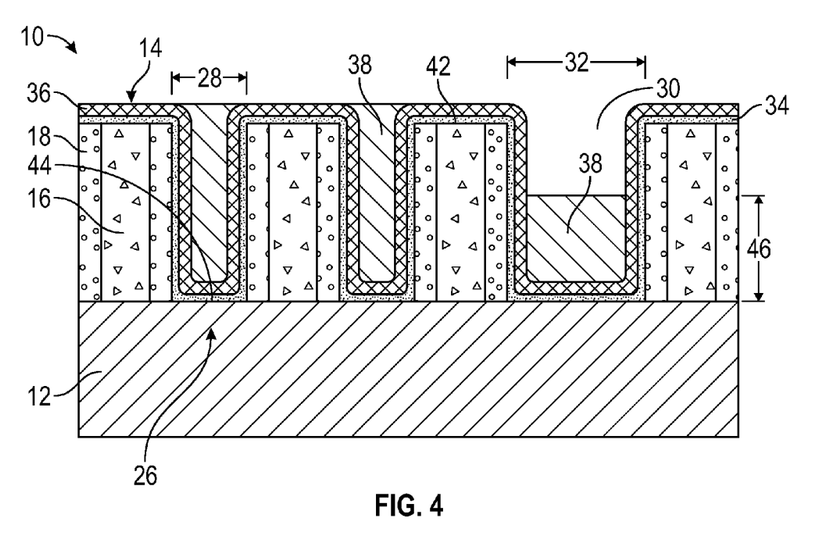

Referring to FIG. 4, the first organic layer 38 is recessed until the first organic layer 38 is at about a dielectric column top surface 42 within the short region 26, and the first organic layer 38 is recessed to about a long region work function height 46 within the long region 30. The long region work function height 46 is intermediate between the dielectric column top surface 42 and a substrate top surface 44. In an exemplary embodiment, the first organic layer 38 is removed with a reactive ion etch using hydrogen and nitrogen or oxygen, and the off-gas is monitored. The first organic layer 38 has a high carbon content, so the off-gas includes higher concentrations of carbon-containing by-products when larger quantities of the first organic layer 38 are exposed to the reactive ion etch. The carbon-containing by-products may include carbon dioxide, carbon monoxide, hydrogen compounds, and cyanides. Therefore, when the first organic layer 38 is removed such that the work function layer 36 is exposed over the dielectric column 14, the quantity of carbon-containing by-products in the off-gas declines. The removal of the first organic layer 38 may be terminated when the concentration of carbon-containing by-products in the off-gas drops. As such, an off-gas concentration, such as a carbon-containing by-products concentration, may be measured and monitored, and the etching process may be terminated when the off-gas concentration falls below an indicator amount. In an alternate embodiment, the first organic layer 38 may be etched for set period of time, or other techniques may be used to determine when to terminate the removal of the first organic layer 38. In an example using an etch for a set period of time, the first organic layer 38 is removed at about a constant rate. The upper surface of the first organic layer 38 is lower in the dip 40 than elsewhere, so the first organic layer 38 is recessed to a lower height (about the long region work function height 46) within the long region 30 than elsewhere. As such, adjustment of the depth of the dip 40 may be used to help set the long region work function height 46. The depth of the dip 40 can be controlled by the controlling the depth of the first organic layer 38 and/or the viscosity of the liquid form of the first organic layer 38, as mentioned above.

Figure 5:
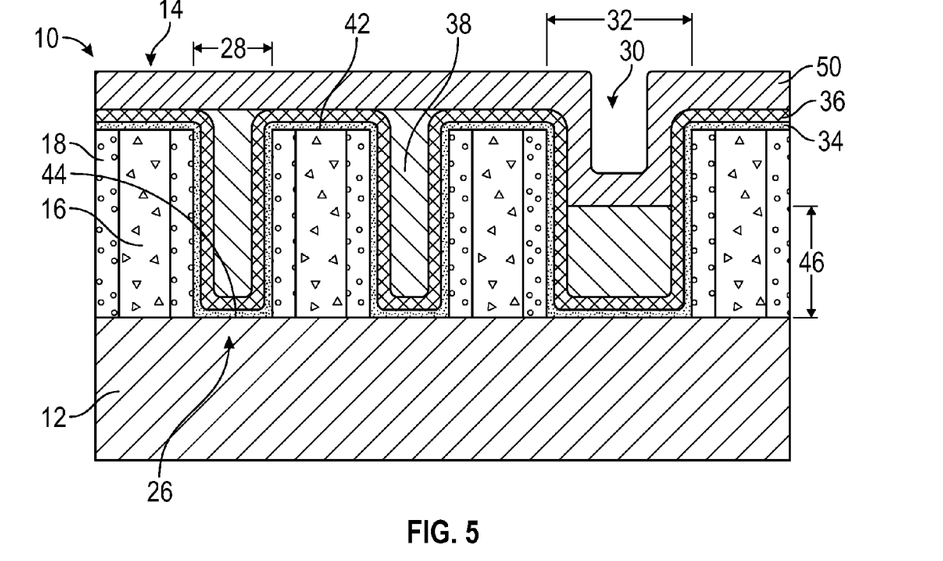

Reference is made to the exemplary embodiment in FIG. 5. A sacrificial layer 50 is formed overlying the substrate 12, the dielectric columns 14, the gate dielectric 34, the work function layer 36, and the remaining first organic layer 38 that is within the long region 30. In an exemplary embodiment, the sacrificial layer 50 includes silicon dioxide, which can be formed by chemical vapor deposition using silane and oxygen, but the sacrificial layer 50 may include other materials in alternate embodiments.

Figure 6:
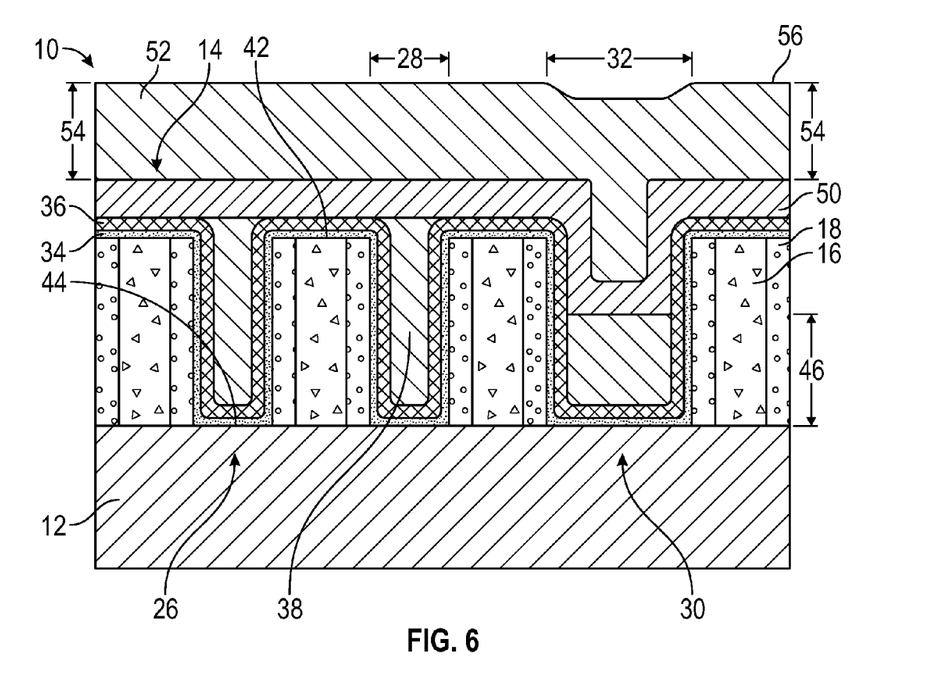

In an exemplary embodiment, a second organic layer 52 is formed overlying the sacrificial layer 50, as illustrated in FIG. 6. The second organic layer 52 is applied as a liquid and then cured, as described above for the first organic layer 38 (illustrated in FIG. 3) and may have a second organic layer depth 54 of about 200 nanometers, such as from about 150 to about 350 nanometers. The second organic layer depth 54 is measured from a top surface of the work function layer 36 overlying the dielectric column 14 to a top surface of the second organic layer 52. The second organic layer depth 54 may be greater than the first organic layer depth 48, so it produces a smoother surface that does not mimic the contours of the underlying structures as much as the thinner first organic layer 38. The second organic layer 52 may be the same material as the first organic layer 38 described above, or the second organic layer 52 may be a different material than the first organic layer 38 in various embodiments. The second organic layer 52 may be an amorphous carbon material, and/or a planarization material, and may include about 50 weight percent carbon or more, or about 70 weight percent carbon or more, as described above for the first organic layer 38.

Figure 7:
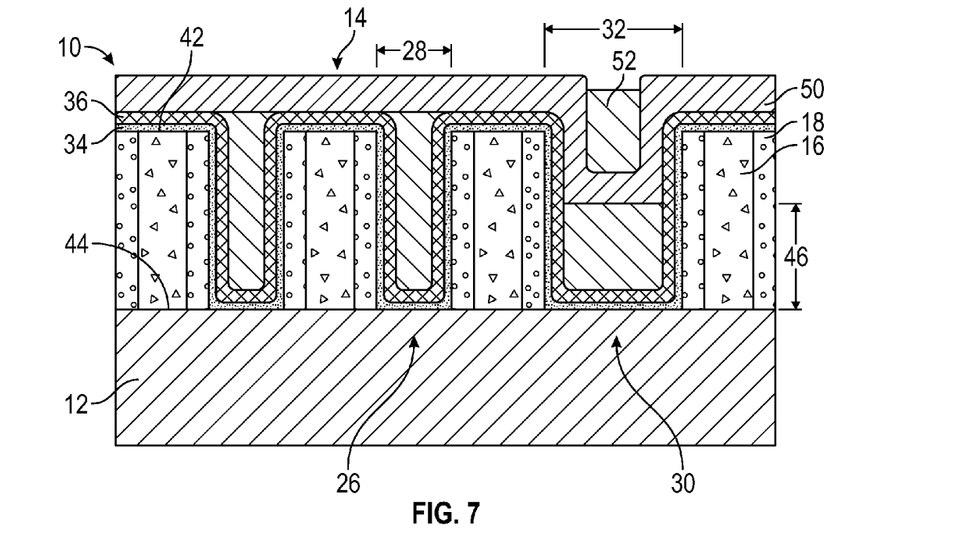

Referring to FIG. 7, with additional reference to FIG. 3, the second organic layer 52 is recessed to expose the sacrificial layer 50 overlying the short region 26 and the dielectric column 14. However, the second organic layer 52 remains overlying the sacrificial layer 50 in the long region 30 because the sacrificial layer 50 dips downward within the long region 30. The first organic layer 38 formed a dip 40 that produced a corresponding dip in the sacrificial layer 50, and the second organic layer upper surface 56 is relatively flat, so the depth of the second organic layer 52 overlying the long region 30 is greater than the depth of the second organic layer 52 overlying the short region 26 and the dielectric column 14. The second organic layer 52 may be removed with a reactive ion etch using hydrogen and nitrogen or oxygen, as described above for the first organic layer 38, which is an anisotropic etching technique. The reactive ion etch may be terminated when the concentration of carbon-containing by-products in the off-gas decreases, again as described above. As such, the second organic layer 52 remains overlying the sacrificial layer 50 in or over the long region 30 while being removed from overlying the short region 26 and the dielectric column 14.

Figure 8:
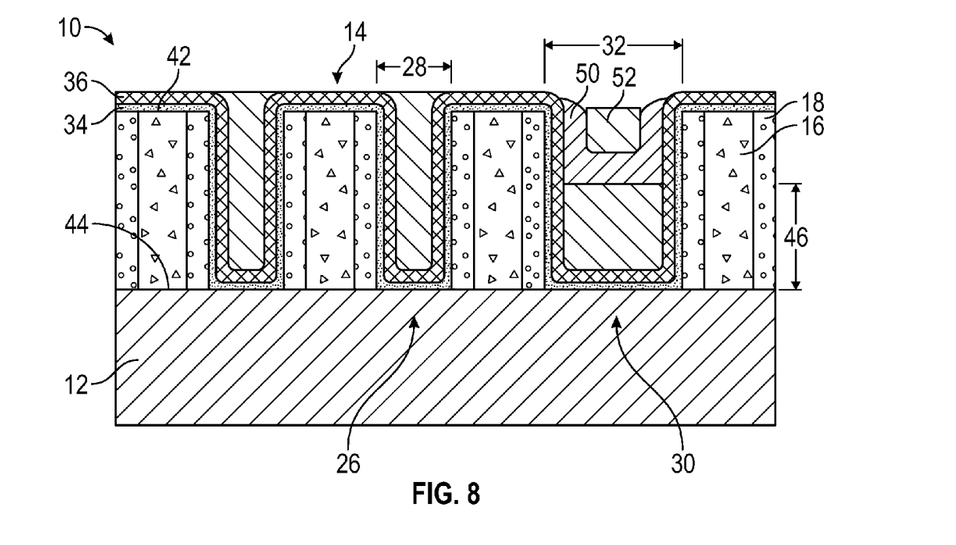

The exposed sacrificial layer 50 is removed from overlying the short region 26 and the dielectric column 14, as illustrated in FIG. 8. The second organic layer 52 that remains overlying the sacrificial layer 50 in the long region 30 may serve as an etch mask such that the sacrificial layer 50 within the long region 30 remains in place. In an exemplary embodiment with a silicon dioxide sacrificial layer 50, the sacrificial layer 50 is removed with a reactive plasma ion etch using tetrafluoromethane, but other etchants may be used in alternate embodiments. Removal of the sacrificial layer 50 exposes the first organic layer 38 within the short region 26.

Figure 9:
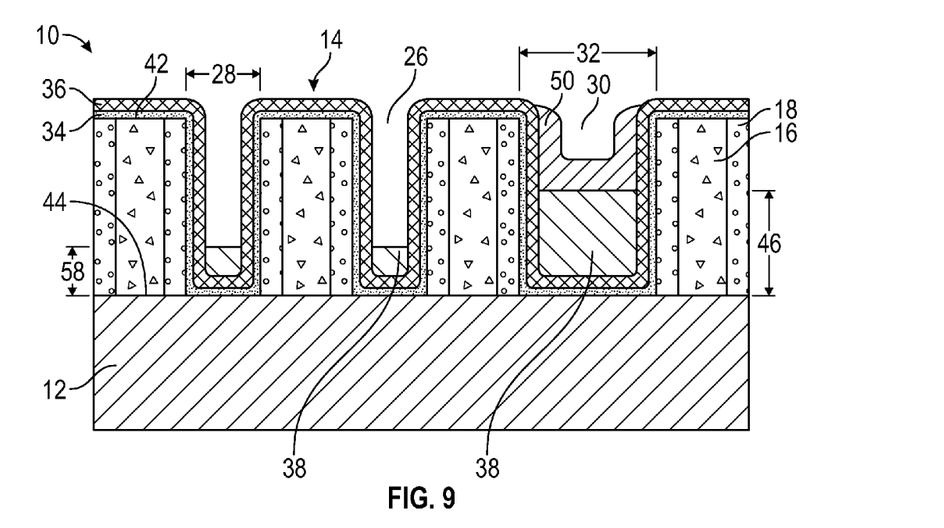

Reference is made to FIG. 9 with continuing reference to FIG. 8. The first organic layer 38 is recessed in the short region 26 to about a short region work function height 58. The short region work function height 58 is between the substrate top surface 44 and the dielectric column top surface 42, so the short region work function height 58 is within the short region 26. The short region work function height 58 may be different than the long region work function height 46, because the first organic layer 38 is separately recessed in the short and long regions 26, 30 (i.e., the first organic layer 38 is recessed in the short and long regions 26, 30 at different times.) The short region work function height 58 may be about the same as the long region work function height 46 in some embodiments, because the recess of the first organic layer 38 in the short region 26 (and previously in the long region 30) can be controlled. In an exemplary embodiment, the first organic layer 38 is recessed in the short region 26 with a reactive ion etch using hydrogen and nitrogen or oxygen, and the etch is terminated after a predetermined period of time that produces the short region work function height 58. The remaining second organic layer 52 overlying the sacrificial layer 50 in or over the long region 30 may be removed when the first organic layer 38 is recessed within the short region 26. The recessing and/or removal of the second organic layer 52, the sacrificial layer 50, and the first organic layer 38 as illustrated and described above in FIGS. 7-9 may be consecutively performed in a single tool by changing etchants and parameters in some embodiments, but the various processes may also be performed in separate tools.

Figure 10:
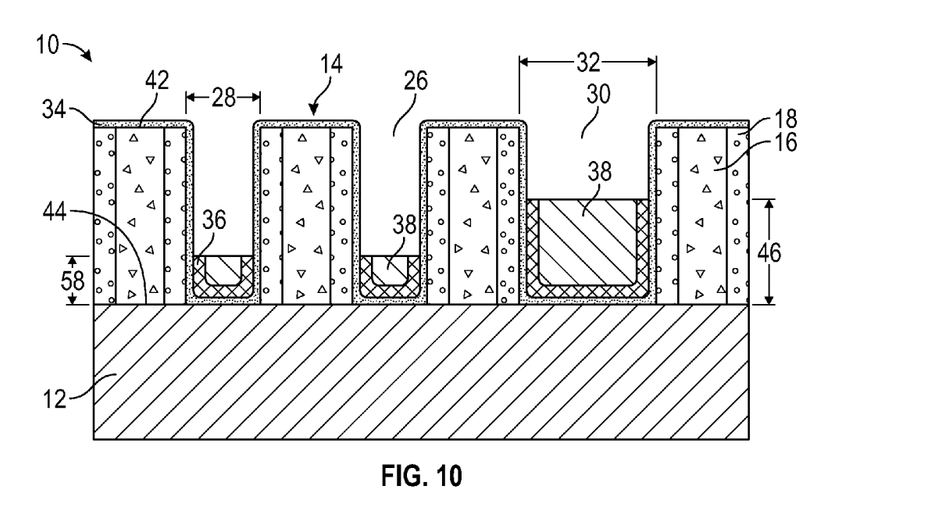

Referring to FIG. 10, the work function layer 36 is recessed in the short and long regions 26, 30 where exposed above the first organic layer 38. The first organic layer 38 serves as an etch barrier to protect the work function layer 36 underlying it. In an exemplary embodiment with titanium nitride and titanium carbide in the work function layer 36, the work function layer 36 may be selectively removed with an inductively coupled reactive ion etch using chlorine gas and argon, but other etchants may be used in alternate embodiments. In another exemplary embodiment with titanium nitride and titanium carbide in the work function layer 36, the work function layer 36 may be selectively removed with a solution of water, hydrogen peroxide and ammonium hydroxide. As such, the work function layer 36 is formed in the long and short regions 30, 26, and then separately recessed within the long and short regions 30, 26 in the absence of any lithography processes or techniques. Lithography may have been used for earlier processes, and/or for later processes, but lithography is not needed or used for the formation through the recessing of the work function layer 36. In some embodiments lithography may be used for other, non-related processes after the formation of the work function layer 36 and before the recessing of the work function layer 36, but such use is not for the processes described above.

Figure 11:
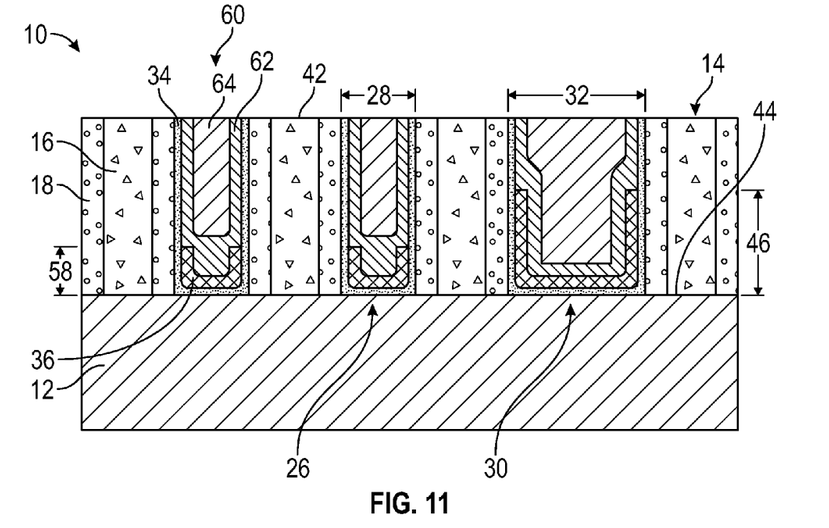

Reference is made to FIG. 11. A replacement metallic gate 60 is formed overlying the work function layer 36 in the long and short regions 30, 26. The replacement metallic gate 60 includes a replacement metallic gate liner 62 and a replacement metallic gate core 64 in some embodiments, but other configurations are also possible. In an exemplary embodiment, the replacement metallic gate liner 62 includes titanium nitride, which can be deposited as described above. The replacement metallic gate core 64 may be tungsten in some embodiments, where tungsten can be deposited by chemical vapor deposition of tungsten hexafluoride and hydrogen. Overburden from the formation of the replacement metallic gate liner and core 62, 64 may be removed by chemical mechanical planarization. The chemical mechanical planarization may also remove the gate dielectric 34 overlying the dielectric column 14, but in some embodiments the gate dielectric 34 may be left overlying the dielectric column 14.

Figure 12:
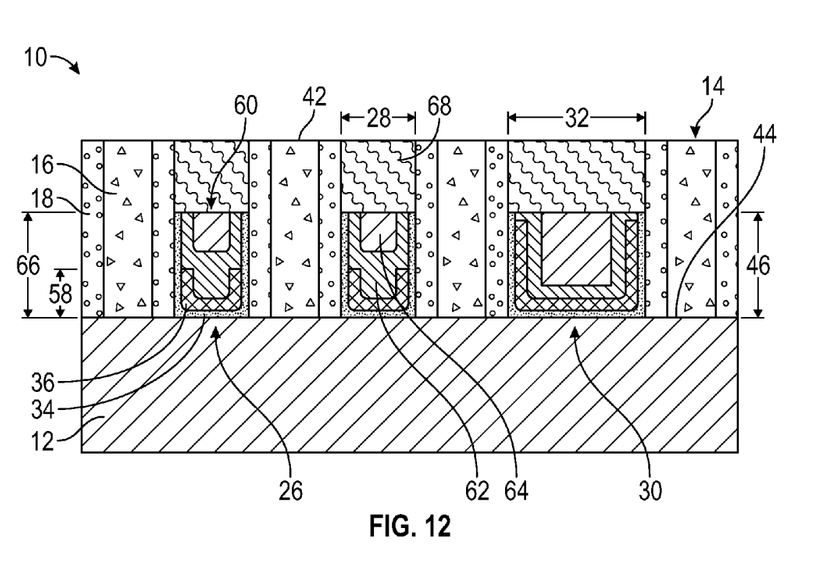

The replacement metallic gate 60 may then be recessed, as illustrated in FIG. 12, to a replacement metallic gate height 66. The replacement metallic gate height 66 is between the dielectric column top surface 42 and the substrate top surface 44, and the replacement metallic gate height 66 in the short region 26 may be about the same as the short region work function height 58, or the replacement metal metallic height 66 in the short region 26 may be greater than or less than the short region replacement metallic gate height 66. In a similar manner, the replacement metallic gate height 66 in the long region 30 may be the same as the replacement metallic gate height 66 in the short region 26, and the replacement metallic gate height 66 in the long region 30 may be greater than, the same as, or less than the long region work function height 46 in various embodiments. The replacement metallic gate 60 can be recessed to a variety of replacement metallic gate heights 66 in various embodiments. The chances of a short between the replacement metallic gate 60 and a contact that may be formed in the place of the dummy core 16 (not illustrated) are reduced when the replacement metallic gate height 66 is less than the dielectric column top surface 42. The dielectric barrier 18 electrically insulates the replacement metallic gate 60 from the dummy core 16, so a short between a contact (not illustrated) in place of the dummy core 16 would most likely be over the top of the dielectric barrier 18. The chances of a short are reduced because the distance over the dielectric barrier 18 (not through the dielectric barrier 18) to the replacement metallic gate 60 is increased when the replacement metallic gate 60 is recessed below the dielectric column top surface 42. In an exemplary embodiment, the replacement metallic gate 60 is recessed with a reactive ion etch using chlorine gas and argon, but other etchants or etch techniques may be used in alternate embodiments.

In an exemplary embodiment (not illustrated) the replacement metallic gate height 66 in the long region 30 is different than the replacement metallic gate height 66 in the short region 26, where a lithography process may be used to recess different replacement metallic gates 60 to different replacement metallic gate heights 66. A cap 68 may be formed overlying the recessed replacement metallic gate 60 in some embodiments. The cap 68 includes silicon nitride in an exemplary embodiment, which may be formed by chemical vapor deposition using ammonia and dichlorosilane with the overburden removed by chemical mechanical planarization. However, the cap 68 may include other materials or methods of formation in other embodiments.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
    forming a work function layer overlying a substrate and a plurality of dielectric columns, wherein the plurality of dielectric columns and the substrate define a short region having a short region width and a long region having a long region width greater than the short region width;
    forming a first organic layer overlying the work function layer;
    recessing the first organic layer in the long region to about the long region work function height;
    recessing the first organic layer in the short region to about the short region work function height;
    recessing the work function layer in the long region to a long region work function height, wherein the long region work function height is between a dielectric column top surface and a substrate top surface; and
    recessing the work function layer in the short region to a short region work function height, wherein the short region work function height is between the dielectric column top surface and the substrate top surface, and wherein recessing the work function layer in the long region and recessing the work function layer in the short region is conducted in the absence of lithography techniques.

2. The method claim 1 wherein recessing the first organic layer in the long region to about the long region work function height further comprises:
    removing the first organic layer from overlying the plurality of dielectric columns while recessing the first organic layer to about the long region work function height within the long region.

3. The method of claim 2 further comprising:
    forming a sacrificial layer overlying the first organic layer after removing the first organic layer from overlying the plurality of dielectric columns.

4. The method of claim 3 further comprising:
    forming a second organic layer overlying the sacrificial layer.

5. The method of claim 4 further comprising:
    removing the sacrificial layer from overlying the short region, wherein the sacrificial layer overlies the first organic layer within the long region after the sacrificial layer is removed from overlying the short region.

6. The method of claim 5 further comprising:
    removing the sacrificial layer from overlying the first organic layer within the long region after recessing the first organic layer in the short region.

7. The method of claim 1 wherein recessing the first organic layer in the long region to about the long region work function height comprises recessing the first organic layer in the long region to about the long region work function height before recessing the first organic layer in the short region to about the short region work function height.

8. The method of claim 1 wherein recessing the first organic layer in the short region comprises recessing the first organic layer to about the short region work function height, wherein the short region work function height is different than the long region work function height.

9. The method of claim 1 wherein forming the first organic layer comprises forming a dip in the first organic layer overlying the long region.

10. The method of claim 1 further comprising:
    forming a gate dielectric overlying the substrate and the plurality of dielectric columns, wherein the gate dielectric is positioned between the work function layer and the substrate, and wherein the gate dielectric is positioned between the work function layer and the plurality of dielectric columns.

11. The method of claim 1 further comprising:
    forming a replacement metallic gate in the short region, wherein the replacement metallic gate comprises a replacement metallic gate height between the dielectric column top surface and the substrate top surface.

12. The method of claim 1 wherein recessing the work function layer in the short region to the short region work function height comprises recessing the work function layer in the short region to the short region work function height wherein the short region work function height is different than the long region work function height.

13. A method of producing an integrated circuit comprising:
    forming a first organic layer overlying a work function layer, wherein the work function layer overlies a substrate and a plurality of dielectric columns, wherein the plurality of dielectric columns and the substrate define a short region having a short region width and a long region having a long region width greater than the short region width;
    recessing the first organic layer to about a long region work function height within the long region while removing the first organic layer from overlying the plurality of dielectric columns, wherein the long region work function height is between a dielectric column top surface a substrate top surface;
    forming a sacrificial layer overlying the first organic layer, the short region, and the plurality of dielectric columns;
    removing the sacrificial layer from over the short region and the plurality of dielectric columns while the sacrificial layer is within the long region;
    recessing the first organic layer in the short region to about a short region work function height between the dielectric column top surface and the substrate top surface;
    removing the sacrificial layer from within the long region;
    removing the work function layer from the short region above the short region work function height; and
    removing the work function layer from the long region above the long region work function height.

14. The method of claim 13 further comprising:
    forming a second organic layer overlying the sacrificial layer after forming the sacrificial layer; and
    removing the second organic layer from over the sacrificial layer outside of the long region.

15. The method of claim 14 wherein forming the first organic layer comprises forming a dip in the first organic layer overlying the long region.

16. The method of claim 13 further comprising:
    forming a replacement metallic gate within the short region, wherein the replacement metallic gate comprises a replacement metallic gate height between the dielectric column top surface and the substrate top surface.

17. The method of claim 13 wherein recessing the first organic layer in the short region comprises recessing the first organic layer in the short region to about the short region work function height, wherein the short region work function height is less than the long region work function height.

18. The method of claim 13 wherein recessing the first organic layer in the short region comprises recessing the first organic layer in the short region to about the short region work function height, wherein the short region work function height is different than the long region work function height.

* * * * *